United States Patent [19]

Fragale et al.

[11] Patent Number: 5,654,562

[45] Date of Patent: Aug. 5, 1997

[54] LATCH RESISTANT INSULATED GATE SEMICONDUCTOR DEVICE

[75] Inventors: William L. Fragale, Scottsdale; Paul J. Groenig; Vasudev Venkatesan, both of Chandler, all of Ariz.

[73] Assignee: Motorola, Inc., Schaumburg, Ill.

[21] Appl. No.: 398,265

[22] Filed: Mar. 3, 1995

[51] Int. Cl.$^6$ .................................................. H01L 29/749

[52] U.S. Cl. .......................... 257/164; 257/165; 257/166; 257/580; 257/582; 257/401; 257/341; 257/342

[58] Field of Search .................................. 257/163–166, 257/580, 582, 341–342, 401

[56] References Cited

U.S. PATENT DOCUMENTS

| | | | |
|---|---|---|---|
| 4,639,754 | 1/1987 | Wheatley et al. | 257/142 |
| 4,860,072 | 8/1989 | Zommer | 257/144 |
| 5,053,847 | 10/1991 | Ito et al. | 257/582 |
| 5,321,295 | 6/1994 | Hisamoto | 257/401 |
| 5,365,082 | 11/1994 | Gill | 257/374 |
| 5,378,911 | 1/1995 | Murakami | 257/334 |

FOREIGN PATENT DOCUMENTS

| | | |
|---|---|---|
| 0068945 | 1/1983 | European Pat. Off. . |
| 597514A2 | 5/1994 | European Pat. Off. ................ 257/582 |
| 2-278880 | 11/1990 | Japan .................................... 257/163 |
| 2278880 | 2/1991 | Japan . |
| 4011780 | 1/1992 | Japan . |

OTHER PUBLICATIONS

"Cell Geometry Effect on IGT Latch–Up," by Yilmaz, IEEE Electron Device Letters, vol. EDL–6, No. 8, Aug. 1985, pp. 419–421.

"MOS-Controlled Thyristors—A New Class of Power Devices," by Temple, IEEE Transactions on Electron Devices, vol. ED–33, No. 10, Oct. 1986, pp. 1609–1618.

Primary Examiner—Jerome Jackson
Assistant Examiner—John Gray
Attorney, Agent, or Firm—Miriam Jackson; George C. Chen

[57] ABSTRACT

An insulated gate semiconductor device (10) is fabricated by providing at least one ballast resistor (40) having a sheet resistance of at least one square. The ballast resistor (40) is formed in the emitter region (17) between two adjacent portions of the base region (26) at the top surface of the semiconductor body in which the device (10) is fabricated. The ballast resistor (40) improves the latch resistance of the device (10) in overload conditions.

12 Claims, 3 Drawing Sheets

LATCH RESISTANT INSULATED GATE SEMICONDUCTOR DEVICE

BACKGROUND OF THE INVENTION

This invention relates, in general, to insulated gate semiconductor devices, and more particularly, an insulated gate semiconductor device which is latch resistant.

Insulated gate semiconductor devices, such as insulated gate bipolar transistors (IGBT), are required to survive overload current conditions (SCSOA) for at least 10 microseconds. Typical overload currents are 10 times the rated current of the device and sufficient to latch-up the IGBT. This latch-up occurs when the parasitic NPN inherent to the IGBT turns on because the base-emitter junction is forward biased by the excessive hole current.

Attempts have been made to minimize the likelihood that the parasitic transistor will be latched. This has been accomplished by adjusting the doping profile of the base and the emitter of the parasitic NPN transistor. This adjustment will typically prevent latch-up from occurring at the rated current, however it is not enough to prevent latch-up from occurring at typical overload currents.

Another attempt has been made to prevent latch-up by providing a ballast voltage which tends to reverse bias the base-emitter of the inherent parasitic transistor. Although this method is effective, it would be desirable to further improve the ability to avoid latch-up. It would also be desirable to improve the ability to avoid latch-up without having other electrical characteristics in particular the on voltage (Von) fall out of the required specification.

Therefore, it would be desirable to provide an improved insulated gate semiconductor device which is latch resistant and has acceptable Von.

DETAILED DESCRIPTION OF THE DRAWINGS

Figure 1:
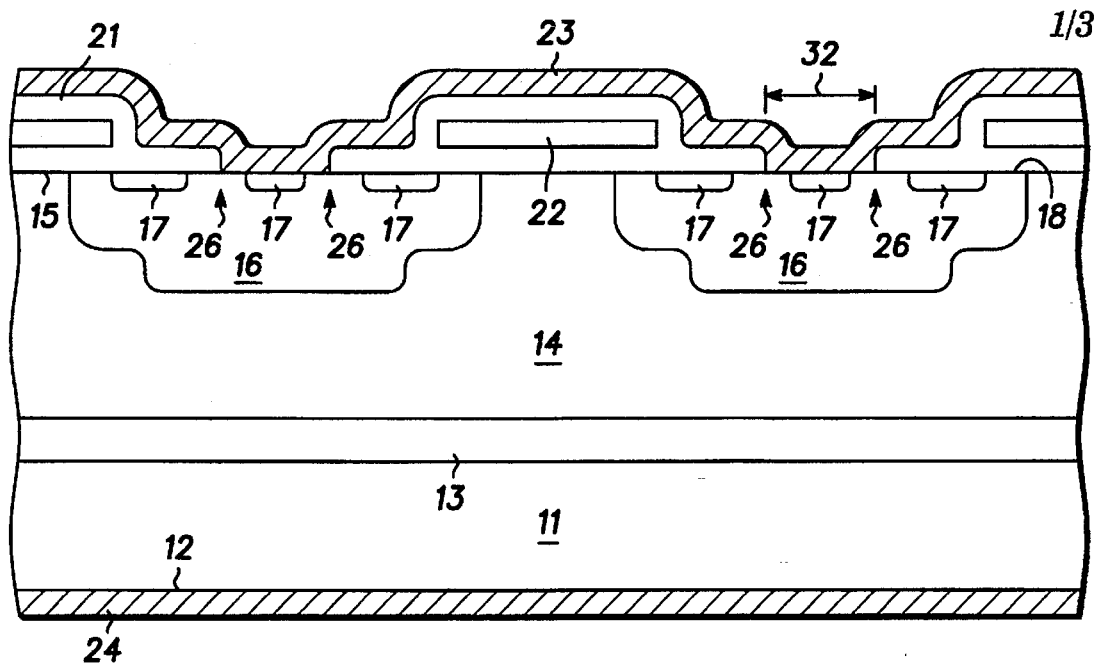
FIG. 1 illustrates an enlarged, cross sectional view of an embodiment of the present invention.

FIG. 1 illustrates an enlarged, cross-sectional view of a portion of an insulated gate semiconductor device 10 in accordance with the present invention. FIG. 1 illustrates the cross-section of the embodiment shown in FIGS. 2–5 through line 1—1 shown in each of those FIGS. 2–5.

FIG. 1 illustrates a preferred embodiment of the present invention. In particular, a vertical IGBT is illustrated. Other devices can benefit from the present invention. Insulated gate semiconductor device 10 is comprised of a semiconductor substrate 11 of a first conductivity type. In this particular embodiment, substrate 11 is comprised of a p-type semiconductor material. A buffer layer 13 is disposed over substrate 11. Buffer layer 13 is of a second conductivity type and in this embodiment is comprised of an n-type semiconductor material. A semiconductor layer 14, typically called the drift region, is disposed over buffer layer 13. Semiconductor layer 14 is of a second conductivity type and is more lightly doped than buffer layer 13. Semiconductor substrate 11, buffer layer 13, and semiconductor layer 14 all comprise a semiconductor body. A doped region or base region 16 is formed in a portion of semiconductor layer 14 extending from the top surface into a portion of semiconductor layer 14. In a vertical device, base regions 16 are laterally spaced apart from one another. Base region 16 is of a first conductivity type and is preferably formed by ion implantation. Note that a plurality of base regions 16 may be formed in semiconductor layer 14, of which only two are shown for illustrative convenience. Also, base region 16 may be a single region having portions of semiconductor layer 14 extend to top surface 15 between portions of base region 16.

A doped region or emitter region 17 is formed in a portion of base region 16 extending from the top surface of semiconductor layer 14. Emitter region 17 is of the second conductivity type. A channel region 18 is formed between emitter region 17 and the periphery of base region 16. Base region portions 26 at top surface 15 and inside gate have a specified configuration. Various configurations of emitter regions 17 at top surface 15 and base region portions 26 at top surface 15 will be further evident in FIGS. 2–5.

An insulating layer 21 serves as a gate oxide between semiconductor layer 14 and a gate 22. Insulating layer 21 also serves to insulate gate 22 from an emitter electrode 23 which is comprised of a metal layer. For simplicity, insulating layer 21 is shown as a single layer, however, those skilled in the art will recognize that a gate oxide layer is formed before the insulating layer above gate 22 and may be formed using different processes. Emitter electrode 23 disposed in an opening 32, typically called a preohmic opening, forms an electrical contact to emitter region 17 and base region 16 or shorts emitter region 17 to base region 16. A metallization layer 24 is formed on and makes electrical contact to the bottom surface of substrate 11 and serves as a collector metallization. Various configurations of opening 32 and are shown in FIGS. 2–5.

Figure 2:
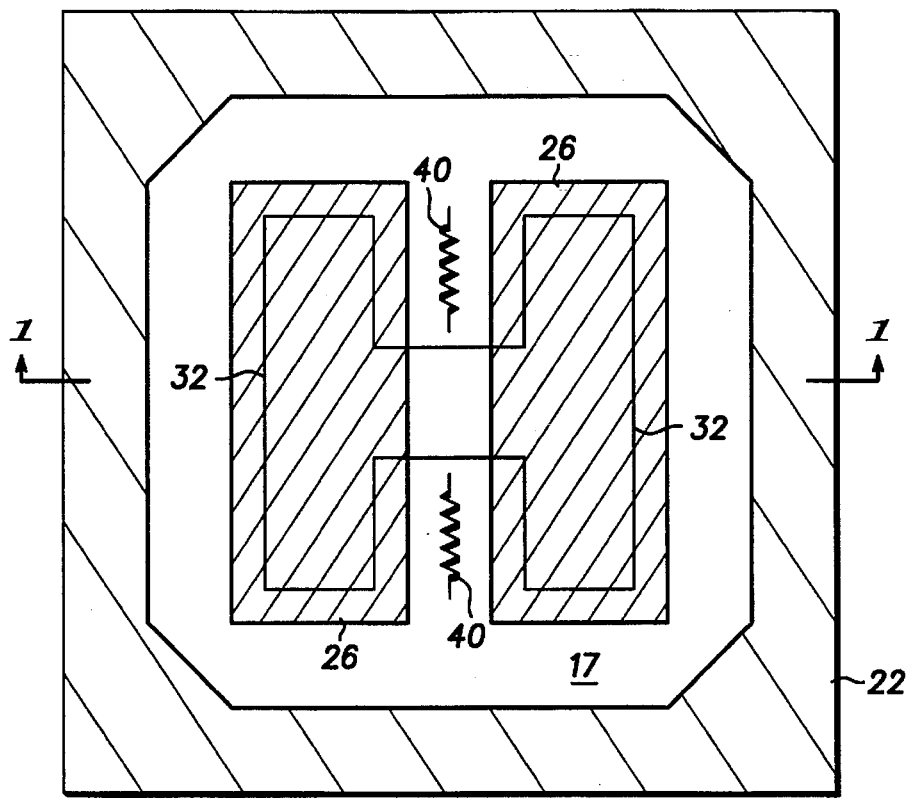
FIG. 2 illustrates a top view of a portion of a first embodiment of the present invention.

FIG. 2 illustrates a top view of a first embodiment of the present invention. A cellular structure is shown in this embodiment, i.e., gate 22 has a donut shape. Insulated gate semiconductor device 10 of the present invention may be comprised of a plurality of the structures shown in FIG. 2. Gate 22 has a central opening in which the active area of semiconductor device 10 is formed. In this embodiment, base region 26 inside gate 22 is comprised of two adjacent regions or portions surrounded by emitter region 17 at top surface 15. Note that a ballast resistor 40 is formed in emitter region 17 between the two adjacent portions of base region 26. In the present invention, the ballast resistor must have a sheet resistance of at least 1 square to provide the ballasting necessary to prevent latch-up in overload current conditions. Using typical doping profiles, ballast resistor 40 is at least 30 ohms in order to provide the necessary latch resistance in overload current conditions. A resistor less than 30 ohms does not provide the latch-up protection necessary for motor control applications. In a preferred embodiment, ballast resistor 40 is less than 400 ohms in order to provide an acceptable Von.

Note that in U.S. Pat. No. 4,860,072, the ballast resistor is very small. FIG. 8 of this patent shows that the ballast resistor between base regions 62b is negligible. It is believed that the ballast resistor is less than one-half of a square in U.S. Pat. No. 4,860,072. A resistor this small is not believed to provide enough resistance to prevent latch-up in overload current conditions.

In a typical insulated gate semiconductor device 10 of the present invention, the length of ballast resistor 40 is one half Of the inside dimension of gate 22 minus emitter contact area 32 which is typically a minimum feature size. Ballast resistor 40 emanates from a central region of the cell. In FIG. 2, emitter contact region 32 forms an "H" structure such that emitter region 17 and base regions 26 are shorted together, in the center of the "H" structure. The vertical portions of the "H" structure of opening 32 are necessary in certain applications where it is desirable to have high unclamped inductive switching (UIS) capability. UIS capability is improved because base region 16 potential is minimized with respect to the potential of emitter region 17 due to the electrical contact of base region 16 adjacent to emitter region 17.

Figure 3:
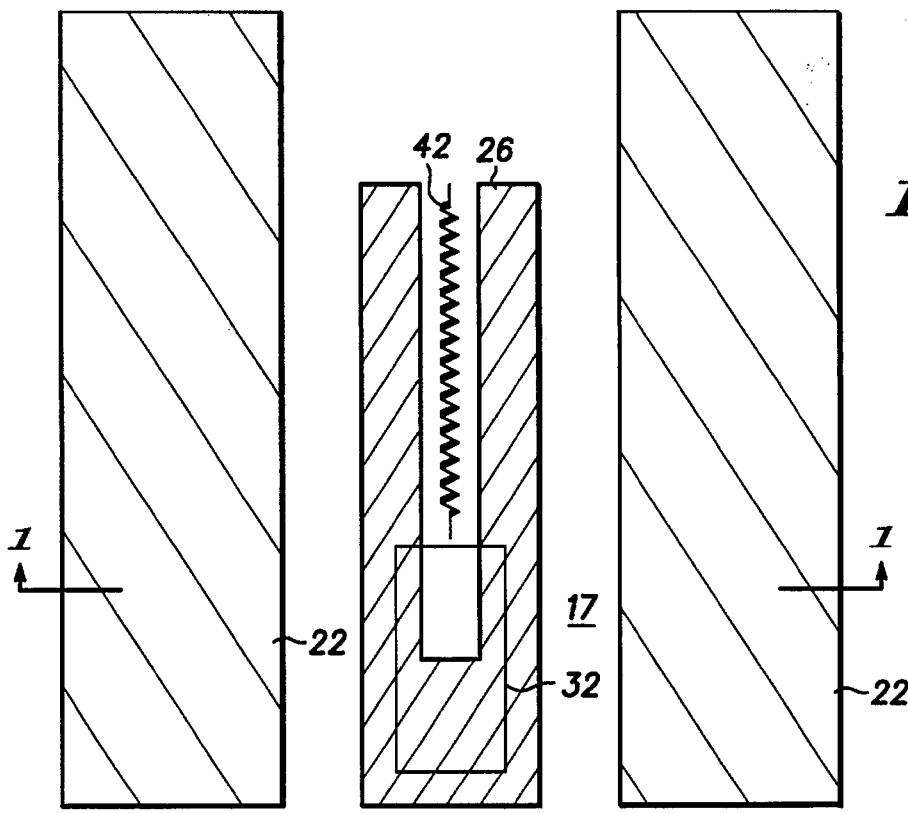
FIG. 3 illustrates a top view of a portion of a second embodiment of the present invention.

FIG. 3 illustrates a second embodiment of the present invention. In this embodiment, a striped geometry, i.e. gate 22 has a stripe configuration, is used. Insulated gate semiconductor device 10 of the present invention may be comprised of a plurality of the structures shown in FIG. 3. Inside the striped structures of gate 22, the active area of insulated gate semiconductor device 10 is fabricated. The same numerals are used to describe the same or similar elements as in FIG. 1. In this configuration, base region 26 forms a "U" configuration having emitter region 17 disposed between the fingers of the "U" and surrounding the "U". In between base regions 26, ballast resistor 42 is formed. In this embodiment, only one ballast resistor 42 is formed, however, it can easily be made longer than the first embodiment shown in FIG. 2, thereby providing higher ballast resistance values. Ballast resistor 42 must have the values as disclosed for both of ballast resistors 40.

Emitter contact opening 32 is formed at the base of the "U" structure such that emitter region 17 and base region 26 are shorted. In this embodiment, it is not necessary to contact a large portion of base region 26 with emitter electrode 23 because it is not necessary to achieve a high UIS capability. If the embodiment shown in FIG. 3 must have a higher UIS capability, emitter contact opening 32 may open up a portion of the fingers of base region 26. Note that the embodiment shown in FIG. 3 also has a ballast resistor 42 which emanates from a central location of insulated gate semiconductor device 10. The "U" cell configuration also has the advantages of using striped geometry for improved packing density versus ballast resistor value and $BV_{CES}$. Improved $BV_{CES}$ is obtained because stripes have cylindrical P-N junctions, instead of the spherical junctions of a cellular geometry.

Figure 4:
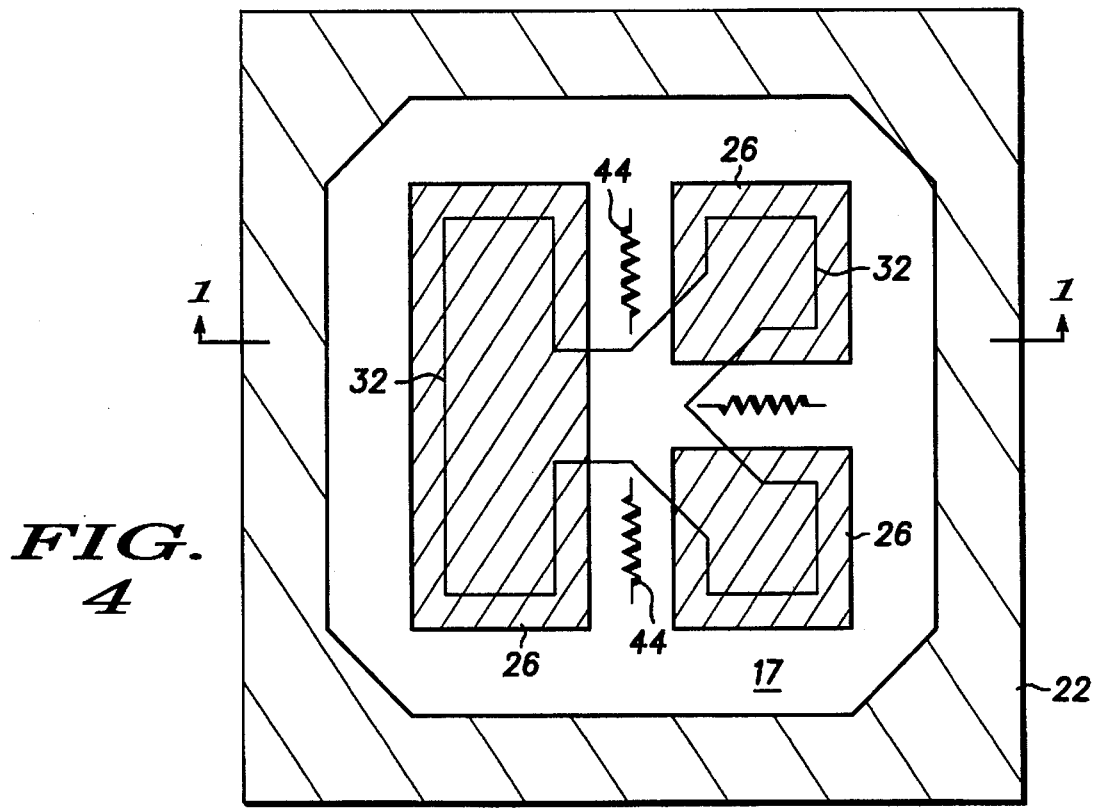
FIG. 4 illustrates a top view of a portion of a third embodiment of the present invention.

FIG. 4 illustrates a top view of a third embodiment of the present invention. This embodiment has a cellular structure. Insulated gate semiconductor device 10 of the present invention may be comprised of a plurality of the structures shown in FIG. 4. Inside the cellular configuration of gate 22, the active area of insulated gate semiconductor device 10 is fabricated. The same numerals are used to describe the same elements as shown in FIG. 1. In this configuration, emitter contact opening 32 forms a "K" configuration. In this embodiment, base region 26 is comprised of three separate portions at top surface 15. Emitter region 17 surrounds the portions of base region 26 at top surface 15. In between base region 26, ballast resistors 44 are formed in emitter region 17. In this embodiment, three ballast resistors 44 are formed which emanate from a central location of insulated gate semiconductor device 10. Ballast resistors 44 must have a total value as disclosed for both of ballast resistors 40 of FIG. 2.

Figure 5:
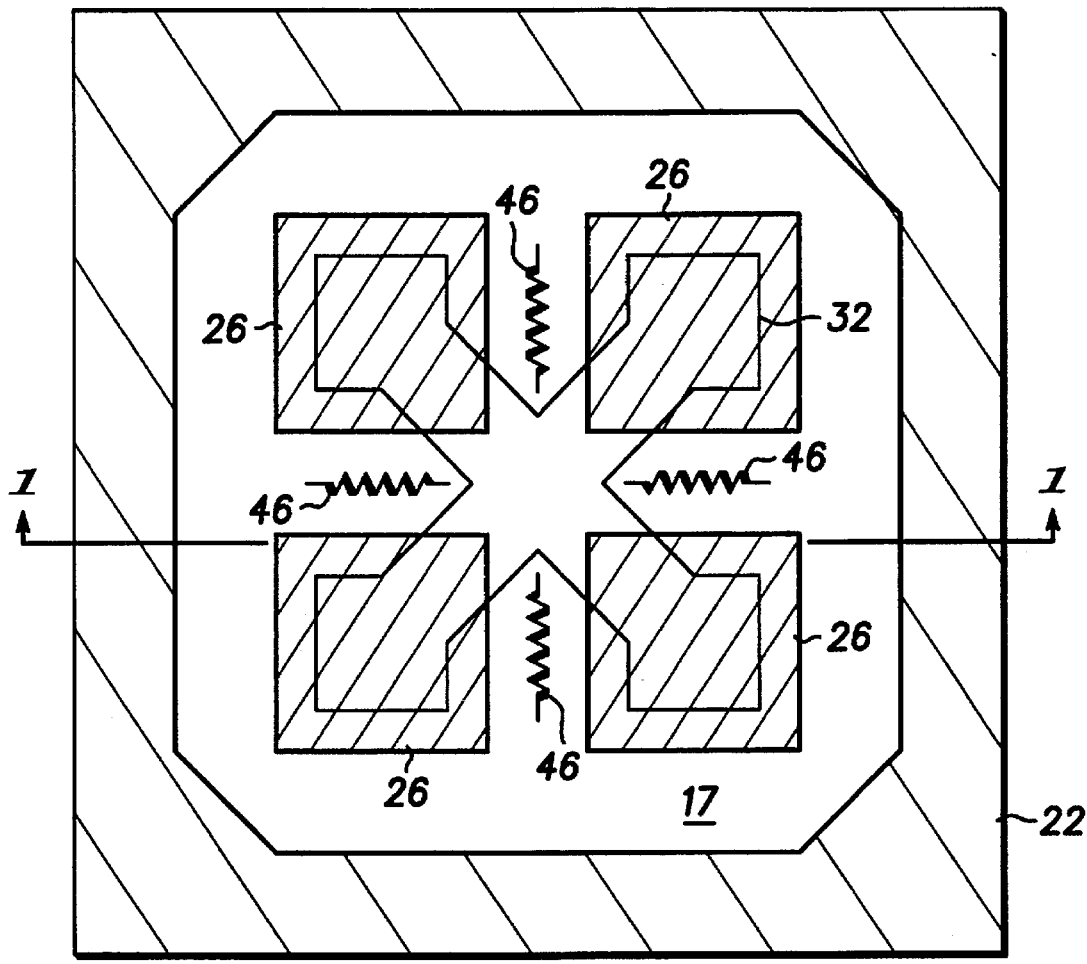
FIG. 5 illustrates a top view of a portion of a fourth embodiment of the present invention.

FIG. 5 illustrates a top view of a fourth embodiment of the present invention. This embodiment also has a cellular structure. Inside the cellular configuration of gate 22, the active area of insulated gate semiconductor device 10 is fabricated. Insulated gate semiconductor device 10 of the present invention may be comprised of a plurality of the structures shown in FIG. 5. The same numerals are used to describe the same elements as shown in FIG. 1. In this configuration, emitter contact opening 32 forms an "X" configuration. In this embodiment, base region 26 is comprised of 4 separate portions at top surface 15. Emitter region 17 surrounds the portions of base region 26 at top surface 15. In between base region 26, ballast resistors 46 are formed in emitter region 17. In this embodiment, four ballast resistors 46 are formed which emanate from a central location of insulated gate semiconductor device 10. Ballast resistors 46 must have a total value as disclosed for both of ballast resistors 40 of FIG. 2.

In each of the embodiments described above, the ballast resistor region 40, 42, 44, and 46 emanates from a center portion of the cell or stripe, providing a more uniform voltage from the base to the emitter ($V_{BE}$) ballasting of the NPN parasitic transistor. Typically, 60% to 80% of the ballast resistance in this invention is in region 40, 42, 44, and 46 of emitter region 17. This results in more uniform current flow along the cell periphery, which improves latch-up and Von.

The magnitude of the ballast resistance is determined by the sheet resistance and length/width layout ratio of region 40, 42, 44, and 46. The sheet resistance of region 40, 42, 44, and 46 may be the same as all of emitter region 17, or a separate implant for the resistor region may be employed. This separate implant is typically of higher sheet resistance, permitting smaller 1/w ratio and higher packing density for lower Von. The dual implanted emitter process is easily achieved using standard photoresist to block the implant in the desired regions.

As can be seen, the device of the present invention inhibits latch-up by adding ballast resistance to the emitter of the parasitic NPN transistor. The cellular embodiment has improved UIS capabilities, while the striped embodiment improves packing density. The ballast resistor may be variable by either implant or layout for optimization of $V_{CE}$(on) and SCSOA tradeoff.

What is claimed is:

1. An insulated gate semiconductor device, comprising:
    a semiconductor body of a first conductivity type, having a top surface;
    a first doped region of a second conductivity type extending into a portion of the semiconductor body and to the top surface;
    a second doped region of the first conductivity type disposed in a portion of the first doped region and extending to the top surface;
    a ballast resistor in the second doped region; and
    an insulating layer formed over the top surface of the semiconductor body, the insulating layer having an opening exposing the top surface of a portion of the first doped region and a portion of the second doped region at the top surface of the semiconductor body wherein the opening has a "K" configuration.

2. The insulated gate semiconductor device of claim 1 wherein the first doped region is comprised of at least two adjacent portions surrounded by the second doped region at the top surface.

3. The insulated gate semiconductor device of claim 1 wherein the first doped region is comprised of at least three adjacent portions surrounded by the second doped region at the top surface.

4. The insulated gate semiconductor device of claim 1 further comprising wherein the ballast resistor has a value of at least 30 ohms.

5. The insulated gate semiconductor device of claim 1 further comprising wherein at least two ballast resistors are formed in the central portion of the second doped region.

6. An insulated gate semiconductor device, comprising:
 a semiconductor body of a first conductivity type, having a top surface;
 a first doped region of a second conductivity type extending into a portion of the semiconductor body and to the top surface;
 a second doped region of the first conductivity type disposed in a portion of the first doped region and extending to the top surface;
 a ballast resistor in the second doped region; and
 an insulating layer formed over the top surface of the semiconductor body, the insulating layer having an opening exposing the top surface of a portion of the first doped region and a portion of the second doped region at the top surface of the semiconductor body wherein the opening has an "X" configuration.

7. The insulated gate semiconductor device of claim 6 wherein the first doped region is comprised of at least four adjacent portions surrounded by the second doped region at the top surface.

8. The insulated gate semiconductor device of claim 6 further comprising wherein at least three ballast resistors are formed in the central portion of the second doped region.

9. The insulated gate semiconductor device of claim 6 further comprising wherein at least four ballast resistors are formed in the central portion of the second doped region.

10. The insulated gate semiconductor device of claim 6 further comprising a gate disposed over the semiconductor body, the gate having a stripe configuration.

11. The insulated gate semiconductor device of claim 6 further comprising a gate disposed over the semiconductor body, the gate having a cellular configuration.

12. An insulated gate semiconductor device, comprising:
 a semiconductor body of a first conductivity type, having a top surface;
 a first doped region of a second conductivity type extending into a portion of the semiconductor body and to the top surface wherein a portion of the first doped region has a "U" configuration;
 a second doped region of the first conductivity type disposed in a portion of the first doped region and extending to the top surface wherein the second doped region has a central portion partially surrounded by the "U" configuration of the portion of the first doped region and wherein the second doped region has an outer portion surrounding the "U" configuration of the portion of the first doped region;
 a ballast resistor in the central portion of the second doped region; and
 an electrode coupled to the central portion of the second doped region and the first doped region.

* * * * *